United States Patent
Chang et al.

(10) Patent No.: US 12,451,444 B2
(45) Date of Patent: Oct. 21, 2025

(54) SEMICONDUCTOR WAFER INCLUDING CHIP GUARD

(71) Applicant: SK hynix Inc., Gyeonggi-do (KR)

(72) Inventors: Heon Yong Chang, Gyeonggi-do (KR); Sun Joo Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 392 days.

(21) Appl. No.: 17/978,645

(22) Filed: Nov. 1, 2022

(65) Prior Publication Data
US 2023/0387040 A1    Nov. 30, 2023

(30) Foreign Application Priority Data
May 31, 2022 (KR) .................. 10-2022-0067243

(51) Int. Cl.
H01L 23/00 (2006.01)
H01L 21/66 (2006.01)
H01L 23/58 (2006.01)

(52) U.S. Cl.
CPC ............ H01L 23/564 (2013.01); H01L 22/32 (2013.01); H01L 23/562 (2013.01); H01L 23/585 (2013.01)

(58) Field of Classification Search
CPC ... H01L 23/585; H01L 23/564; H01L 23/562; H01L 22/30; H01L 22/32; H01L 22/34; H01L 23/5286; H01L 23/5226; H01L 21/74; H01L 21/743; H10D 84/961; H10D 84/895; H10D 84/858; H10D 84/857; H10D 84/0191; H10D 84/0156
See application file for complete search history.

(56) References Cited

U.S. PATENT DOCUMENTS

| 8,293,545 | B2 | 10/2012 | Cong et al. | |
| 10,418,312 | B2 | 9/2019 | Sarkar et al. | |
| 2013/0026466 | A1* | 1/2013 | Pagani | H01L 24/05 |
| | | | | 257/E23.179 |
| 2013/0027073 | A1* | 1/2013 | Pagani | H01L 22/34 |
| | | | | 257/620 |
| 2020/0357755 | A1* | 11/2020 | Shibib | H10D 30/668 |
| 2023/0140743 | A1* | 5/2023 | Hu | H01L 25/0657 |
| | | | | 257/653 |

FOREIGN PATENT DOCUMENTS

WO    WO-2014045989 A1 *   3/2014   ............. H01L 22/32

OTHER PUBLICATIONS

English translation of WO-2014045989-A1 (Year: 2014).*

* cited by examiner

Primary Examiner — Zandra V Smith
Assistant Examiner — Douglas Yap
(74) Attorney, Agent, or Firm — IP & T GROUP LLP (57) ABSTRACT

A semiconductor wafer includes at least one chip region disposed in a substrate, a first chip guard disposed over the substrate in a chip sealing region positioned outside the at least one chip region, a second chip guard disposed over the substrate in a scribe lane region positioned outside the chip sealing region, and a test circuit pattern disposed in the scribe lane region and including a ground line electrically connected to a ground well in the substrate. The second chip guard includes a ground wiring layer electrically connected to the ground line of the test circuit pattern.

25 Claims, 9 Drawing Sheets

SEMICONDUCTOR WAFER INCLUDING CHIP GUARD

CROSS-REFERENCE TO RELATED APPLICATIONS

The present application claims priority under 35 U.S.C. 119(a) to Korean Application No. 10-2022-0067243, filed on May 31, 2022, which is incorporated herein by reference in its entirety.

BACKGROUND

1. Technical Field

The present disclosure relates generally to a semiconductor wafer technology and, more particularly, to a semiconductor wafer including a chip guard.

2. Related Art

Through semiconductor integration processes, a plurality of semiconductor chip regions separated from each other by a scribe lane region as a boundary may be formed on a semiconductor wafer. Then, the plurality of semiconductor chip regions may be separated into a plurality of semiconductor chips through a wafer sawing process. As an example, a protection structure such as a guard ring may be disposed in an outer region of each of the plurality of semiconductor chip regions to protect integrated circuits therein. The guard ring may prevent moisture from penetrating into the plurality of semiconductor chip regions from outside the plurality of semiconductor chip regions, thereby preventing the integrated circuits from being damaged by the moisture.

SUMMARY

A semiconductor wafer, according to an embodiment, may include at least one chip region disposed in a substrate, a first chip guard disposed over the substrate in a chip sealing region positioned outside the at least one chip region, a second chip guard disposed over the substrate in a scribe lane region positioned outside the chip sealing region, and a test circuit pattern disposed in the scribe lane region and including a ground line electrically connected to a ground well in the substrate. The second chip guard may include a ground wiring layer electrically connected to the ground line of the test circuit pattern.

A semiconductor wafer according to another embodiment may include at least one chip region disposed in a substrate, a chip guard disposed over the substrate in a scribe lane region disposed outside the at least one chip region, and a test circuit pattern disposed in the scribe lane region and including a ground line electrically connected to a ground well of the substrate. The chip guard may include a ground wiring layer electrically connected to the ground line.

A semiconductor wafer according to still another embodiment may include at least four chip regions disposed in a substrate, at least four chip sealing regions corresponding to said at least four chip regions, a scribe lane region surrounding all of the at least four chip sealing regions and filling a space between the at least four chip sealing regions and at least three test circuit patterns positioned laterally each of said at least four chip regions in the scribe lane region. Each of the at least four chip sealing regions surrounds a corresponding one of the at least four chip regions. The semiconductor wafer may further include integrated circuits in the at least four chip regions, first chip guards in the at least four chip sealing regions, and second chip guards in the scribe lane region. The first chip guards are directly connected ground wells of the substrate, and the second chip guards are electrically connected to ground wells of substrate via the test circuit patterns through ground wiring layers.

DETAILED DESCRIPTION

Hereinafter, embodiments of the present disclosure will be described in detail with reference to the accompanying drawings. In the drawings, to clearly express the components of each device, the sizes of the components, such as width and thickness of the components may be enlarged. The terms used herein may correspond to words selected in consideration of their functions in the embodiments, and the meanings of the terms may be construed to be different according to the ordinary skill in the art to which the embodiments belong. If expressly defined in detail, the terms may be construed according to the definitions. Unless otherwise defined, the terms (including technical and scientific terms) used herein have the same meaning as commonly understood by one of ordinary skill in the art to which the embodiments belong.

In addition, expression of a singular form of a word should be understood to include the plural forms of the word unless clearly used otherwise in the context. It will be understood that the terms "comprise", "include", or "have" are intended to specify the presence of a feature, a number, a step, an operation, a component, an element, a part, or combinations thereof, however, not used to preclude the presence or possibility of addition one or more other features, numbers, steps, operations, components, elements, parts, or combinations thereof.

Same reference numerals may refer to same devices throughout the specification. Even though a reference numeral may not be mentioned or described with reference to a drawing, the reference numeral may be mentioned or described with reference to another drawing. In addition, even though a reference numeral may not be shown in a drawing, it may be shown in another drawing.

Figure 1:
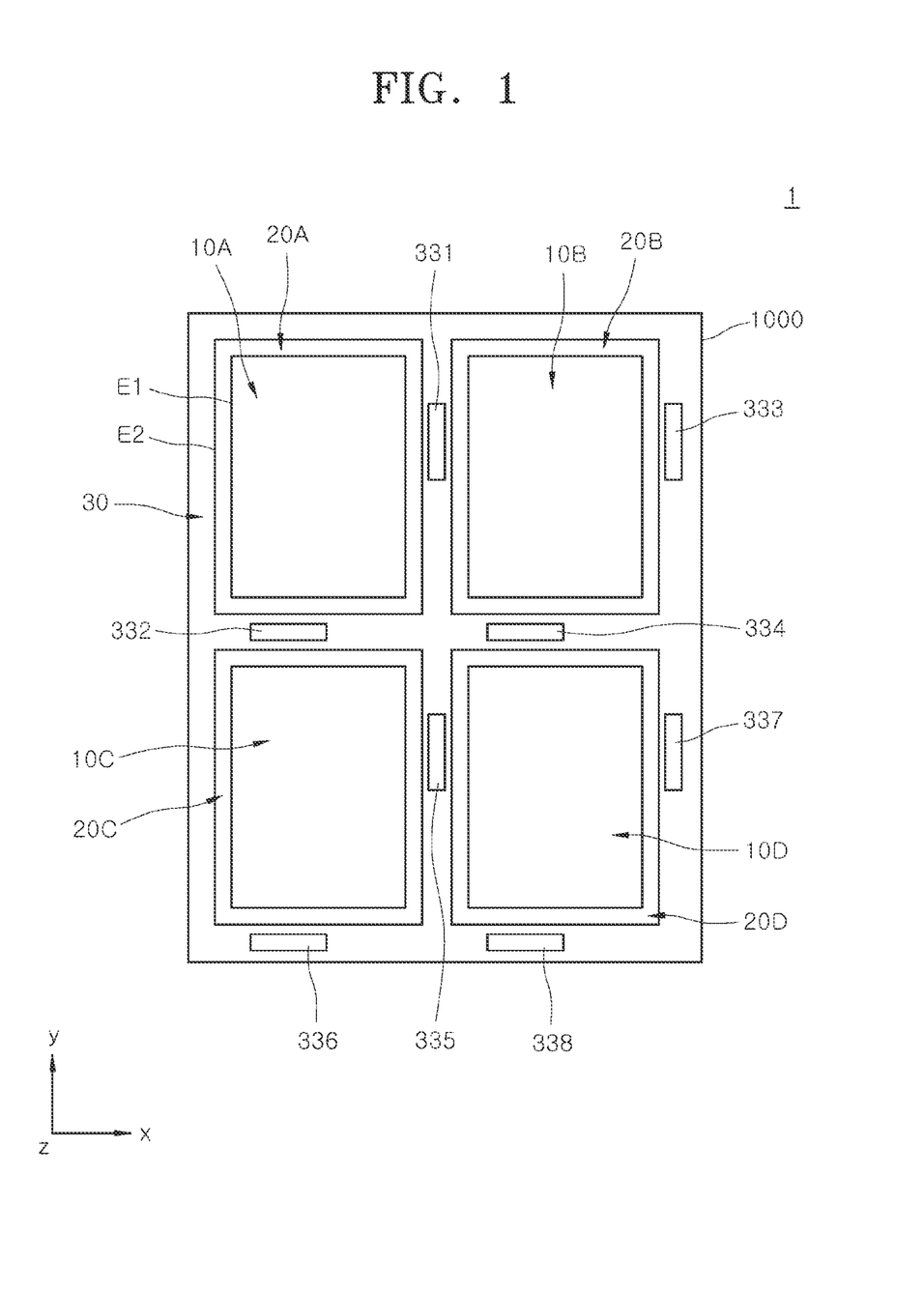
FIG. 1 is a simplified plan view schematic illustrating a semiconductor wafer according to an embodiment of the present disclosure.

FIG. 1 is a simplified plan view schematic illustrating a semiconductor wafer 1 according to an embodiment of the present disclosure. The semiconductor wafer 1 may include at least one chip region and chip sealing region, for example, four chip regions 10A, 10B, 10C, and 10D and four chip sealing regions 20A, 20B, 20C, and 20D in this embodiment, and a scribe lane region 30. Referring now to FIG. 1, an embodiment is described comprising four chip regions 10A, 10B, 10C, and 10D, four chip sealing regions 20A, 20B, 20C, and 20D, and scribe lane region 30 disposed between the four different chip sealing regions 20A, 20B, 20C, and 20D.

In each of the chip regions 10A, 10B, 10C, and 10D, a semiconductor chip may be formed. The semiconductor chips formed in the chip regions 10A, 10B, 10C, and 10D may be the same or substantially the same to each other. The semiconductor chips may include various integrated circuits (e.g., 100 of FIG. 2) related to the operations of the semiconductor chips, as will be described later with reference to FIGS. 2 to 7. After formation of the integrated circuits 100 on the semiconductor wafer 1 is completed, the chip regions 10A, 10B, 10C, and 10D of the semiconductor wafer 1 may be separated.

The chip sealing regions 20A, 20B, 20C, and 20D may be positioned outside the chip regions 10A, 10B, 10C, and 10D, respectively. Each of the chip sealing regions 20A, 20B, 20C, and 20D may form a first boundary E1 with the corresponding one of the chip region 10A, 10C, 10C, and 10D. Each of the chip sealing regions 20A, 20B, 20C, and 20D may form a second boundary E2 with the scribe lane region 30. Each of the chip sealing regions 20A, 20B, 20C, and 20D may be positioned to surround a corresponding one of the chip regions 10A, 10B, 10C, and 10D. A first chip guard 200 may be disposed in each of the chip sealing regions 20A, 20B, 20C, and 20D, as described in more detail with reference to FIGS. 2 to 7.

The scribe lane region 30 may be positioned outside the chip sealing regions 20A, 20B, 20C, and 20D. Test circuit patterns 331, 332, 333, 334, 335, 336, 337, and 338 may be disposed in the scribe lane region 30. Also, as described with reference to FIGS. 2 to 7, a second chip guard (310 of FIG. 2), and a third chip guard (320 of FIG. 2), may be disposed in the scribe lane region 30.

As an example, FIG. 1 illustrates that the semiconductor wafer 1 includes four chip regions 10A, 10B, 10C, and 10D and four chip sealing regions 20A, 20B, 20C, and 20D, however, the embodiments of the present disclosure may not be limited thereto. The semiconductor wafer 1 may have various different numbers of chip regions and chip sealing regions corresponding to the various different numbers of chip regions. Also, although FIG. 1 illustrates two test circuit patterns respectively corresponding to one of the four chip regions 10A, 10B, 10C, and 10D, the embodiments of the present disclosure may not be limited thereto. The position and number of the test circuit patterns corresponding to one of the four chip regions 10A, 10B, 10C, and 10D may be variously modified.

Figure 2:
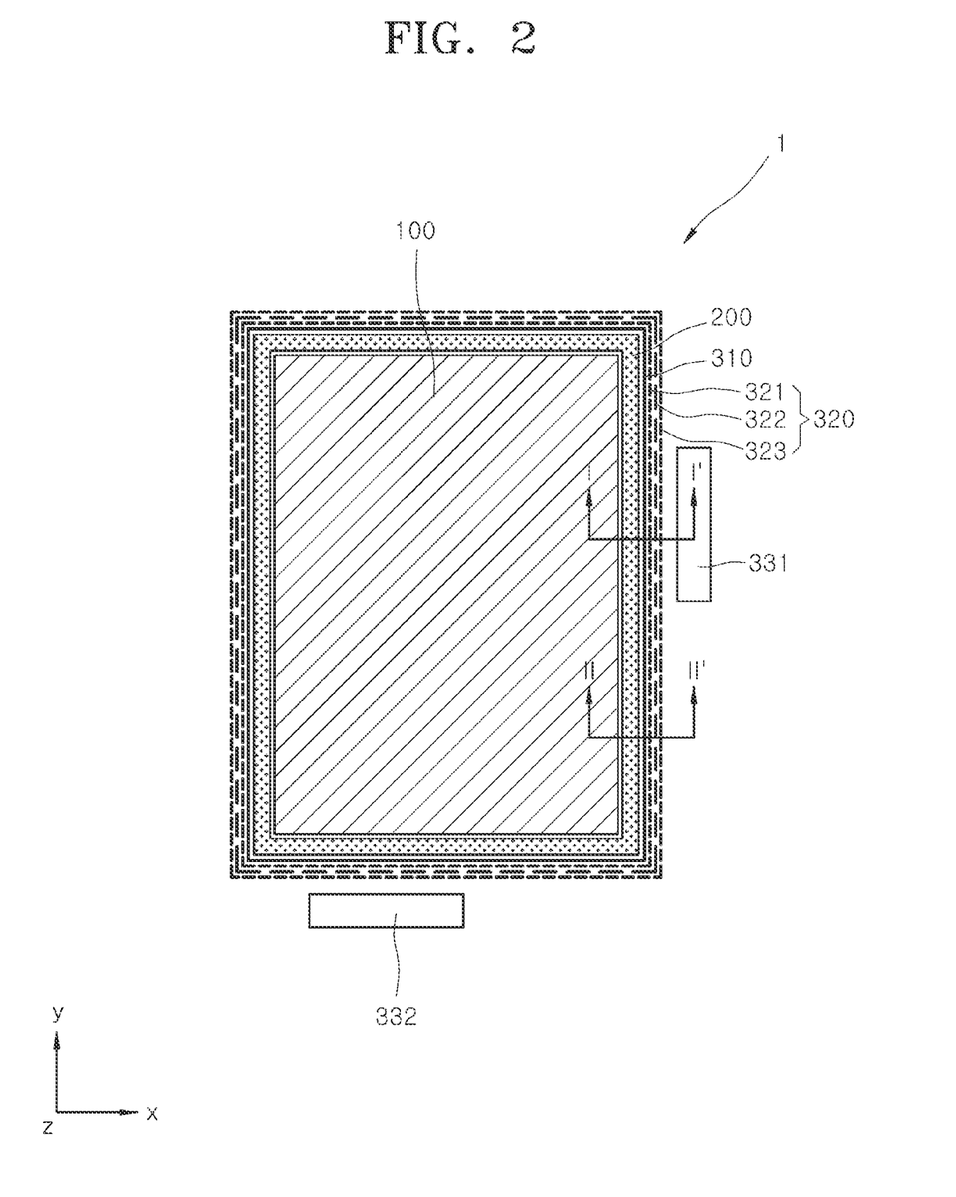
FIG. 2 is a simplified plan view schematic illustrating components disposed in a chip region and a peripheral region of a semiconductor wafer according to an embodiment of the present disclosure.
Figure 3:
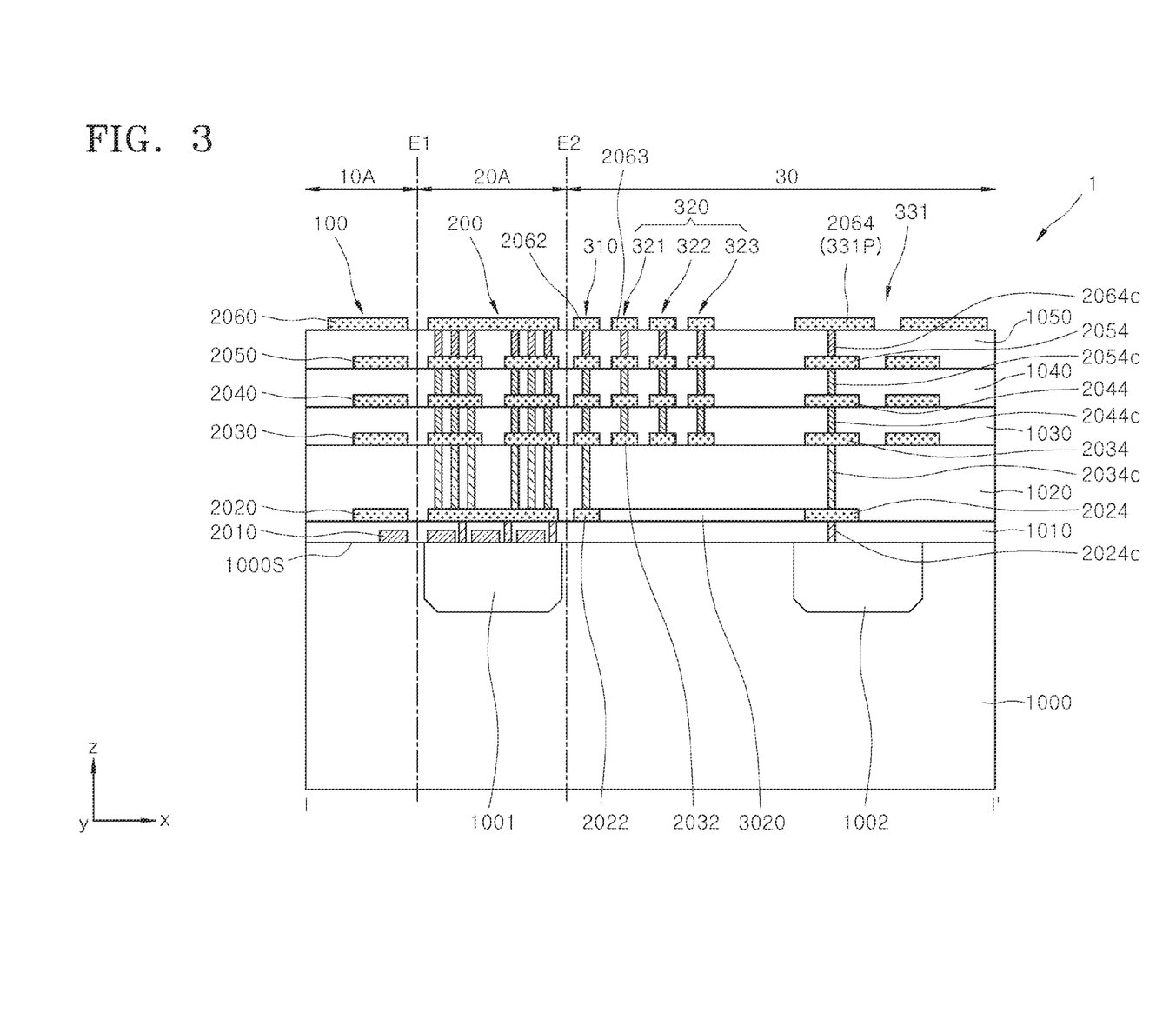
FIG. 3 is a simplified schematic of a cross-sectional view taken along the line I-I' of the semiconductor wafer of FIG. 2.
Figure 4:
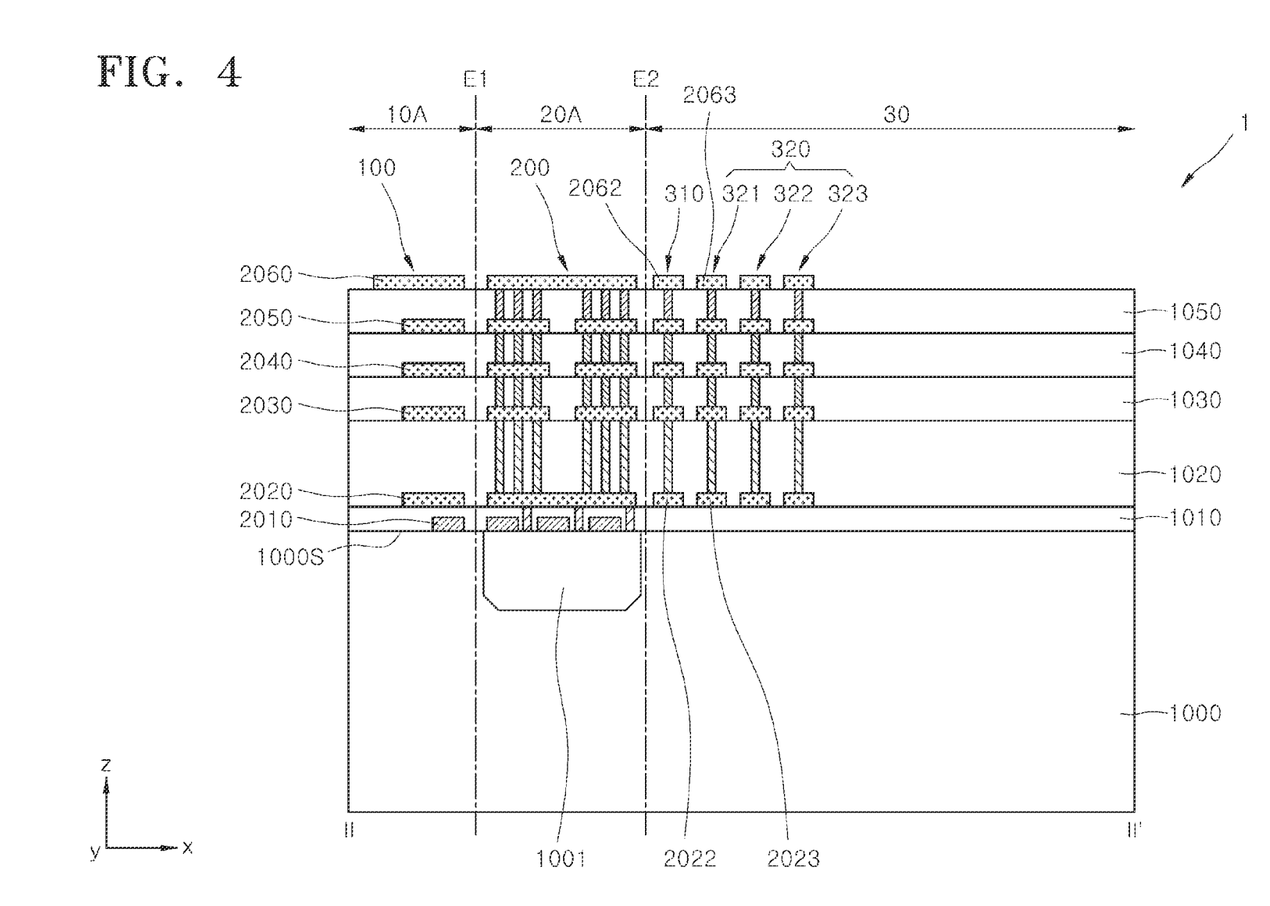
FIG. 4 is a simplified schematic of a cross-sectional view taken along the line II-II' of the semiconductor wafer of FIG. 2.
Figure 5:
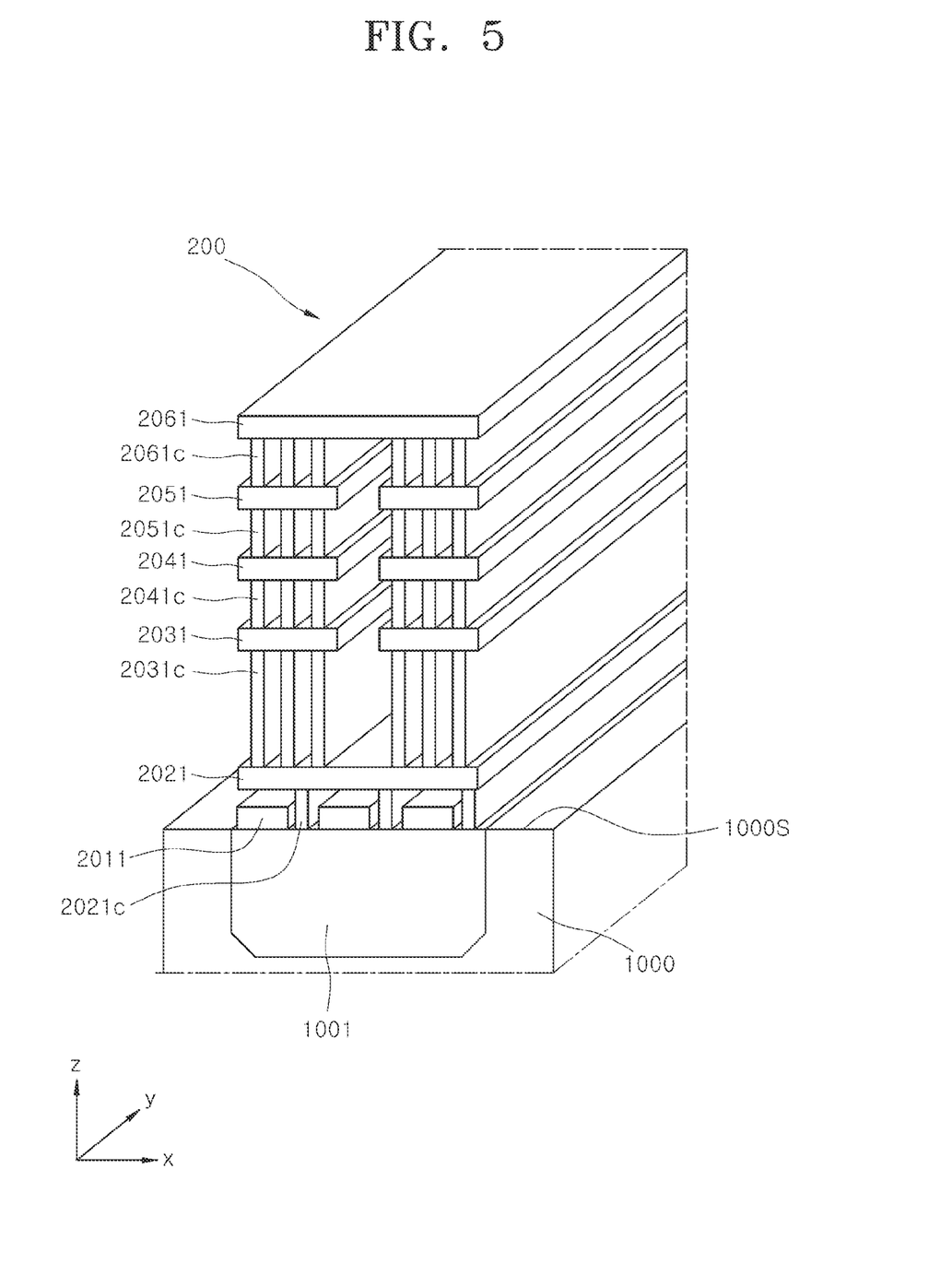
FIG. 5 is a simplified schematic of a perspective view illustrating a first chip guard of FIGS. 2 to 4.
Figure 6:
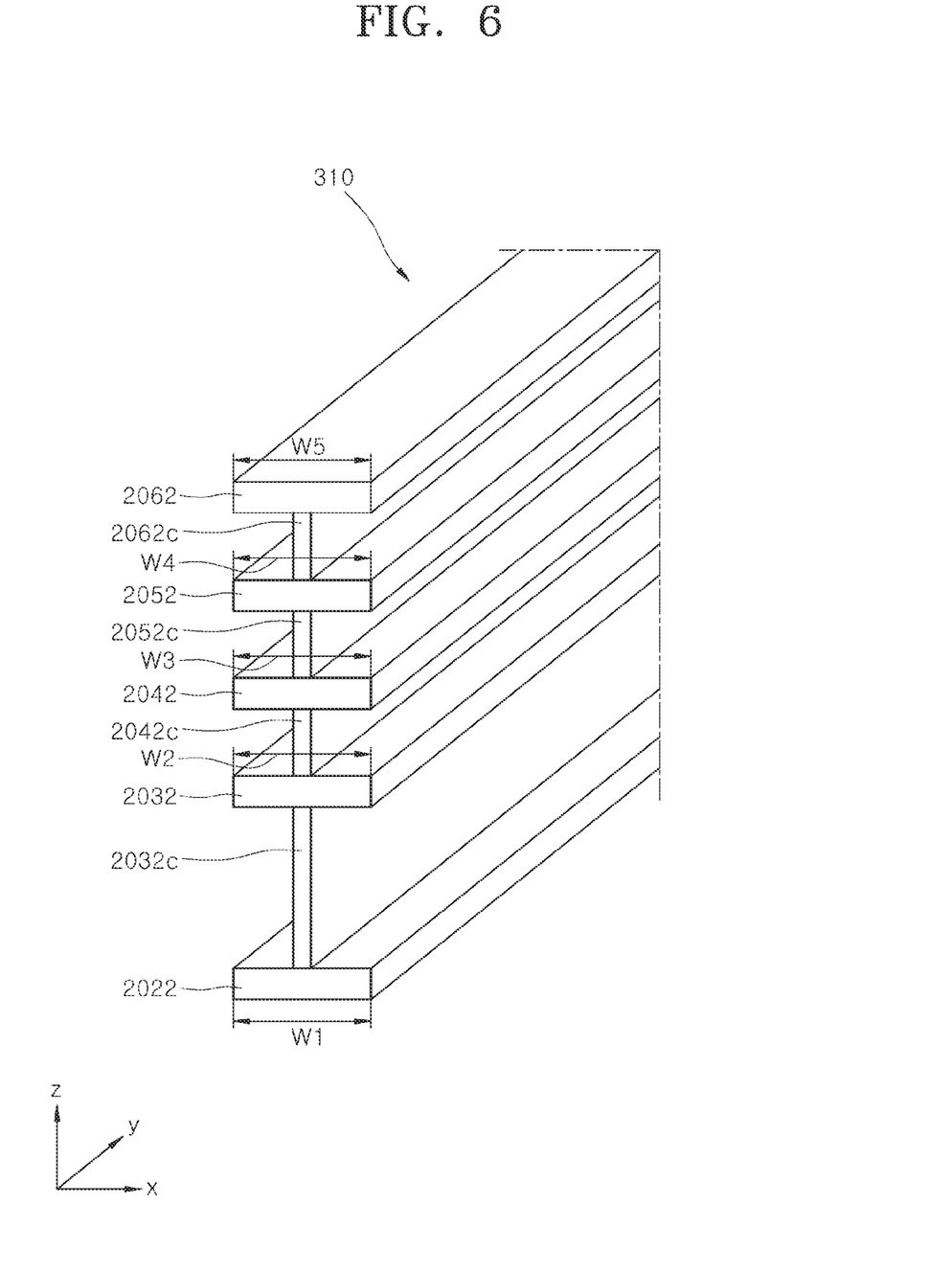
FIG. 6 is a simplified schematic of a perspective view illustrating a second chip guard of FIGS. 2 to 4.
Figure 7:
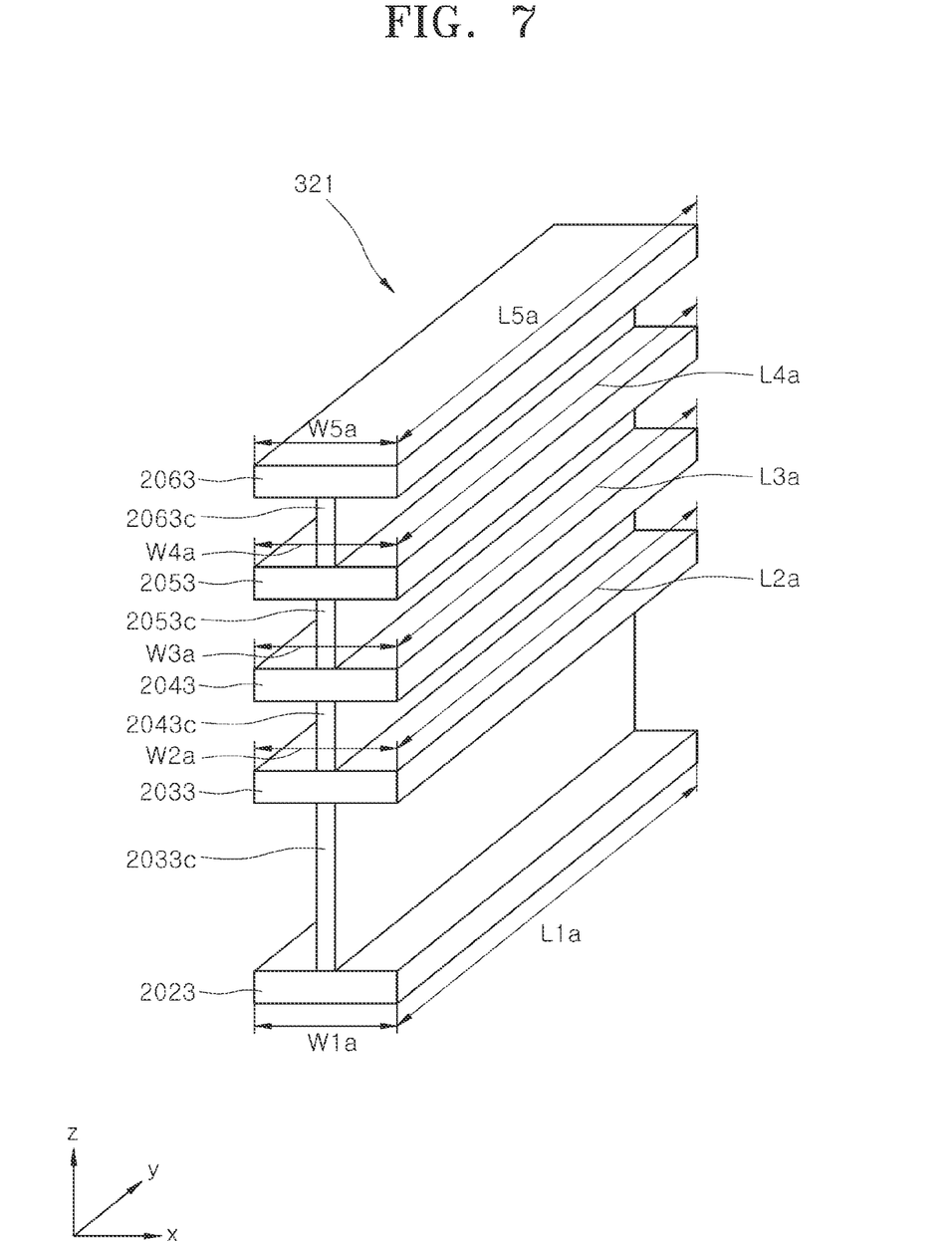
FIG. 7 is a simplified schematic of a perspective view illustrating a third chip guard of FIGS. 2 to 4.

FIG. 2 is a simplified plan view schematic illustrating the components disposed in the chip region and the peripheral region of the semiconductor wafer according to an embodiment of the present disclosure. FIG. 3 is a simplified schematic of a cross-sectional view taken along the line I-I' of the semiconductor wafer of FIG. 2. FIG. 4 is a simplified schematic of a cross-sectional view taken along the II-II' of the semiconductor wafer of FIG. 2. FIG. 5 is a simplified schematic of a perspective view illustrating the first chip guard of FIGS. 2 to 4. FIG. 6 is a simplified schematic of a perspective view illustrating a second chip guard of FIGS. 2 to 4. FIG. 7 is a simplified schematic of a perspective view illustrating a third chip guard of FIGS. 2 to 4.

The chip region of FIG. 2 may be one of the first to fourth chip regions 10A, 10B, 10C, and 10D of the semiconductor wafer of FIG. 1. For convenience, hereinafter, the chip region 10A among the four chip regions 10A, 10B, 10C, and 10D of FIG. 1 will be used as the chip region of FIG. 2.

Referring to FIG. 2, together with FIG. 1, the integrated circuit 100 of FIG. 2 may be disposed in the chip region 10A of FIG. 1. The first chip guard 200 of FIG. 2 may be disposed in the chip sealing region 20A of FIG. 1. The second chip guard 310, the third chip guard 320, and the test circuit patterns 331 and 332 of FIG. 2 may be disposed in the scribe lane region 30 of FIG. 1.

In an embodiment, in the chip region 10A, the integrated circuit 100 may include electronic devices constituting a semiconductor chip and various circuits applied to drive the electronic devices. Referring to FIGS. 3 and 4, the integrated circuit 100 may include a substrate 1000, a gate structure 2010 disposed on the substrate 1000, first to fifth circuit pattern layers 2020, 2030, 2040, 2050, and 2060 that are disposed over the gate structure 2010 to be spaced apart from each other in a direction that is substantially perpendicular to a surface 1000S of the substrate 1000.

The substrate 1000 may include active regions in which devices are formed and substrate isolation regions for electrically isolating the active regions. The substrate 1000 may be doped with an n-type dopant. The substrate 1000 may be doped with a p-type dopant. The substrate 1000 may include an n-type doping well therein. The substrate 1000 may include a p-type doping well therein. The gate structure 2010 may include a gate dielectric layer and a gate electrode layer. The gate dielectric layer and the gate electrode layer may be sequentially disposed on the substrate 1000. The gate structure 2010 may include a word line extending in a direction (e.g., the y-direction). Suitable materials for the gate electrode layer may include, for example, doped silicon (doped-Si), tungsten (W), titanium (Ti), tantalum (Ta), tungsten nitride, titanium nitride, tantalum nitride, tungsten silicide, titanium silicide, tantalum silicide, or a combination of two or more thereof.

Each of the first to fifth circuit pattern layers 2020, 2030, 2040, 2050, and 2060 may include, for example, tungsten (W), aluminum (Al), copper (Cu), or a combination of two or more thereof. Contact pattern layers may be included for connecting two or more circuit pattern layers selected from the first to fifth circuit pattern layers 2020, 2030, 2040, 2050, and 2060 to each other. Each of the contact pattern layers may have the form of a plug or a via, for example. The material of each of the contact pattern layers may be substantially the same as that of the first to fifth circuit pattern layers 2020, 2030, 2040, 2050, and 2060.

In an embodiment, the semiconductor chip formed in the chip region 10A may be a DRAM chip, and the first circuit pattern layer 2020 may include a bit line, and the second to fifth circuit pattern layers 2030, 2040, 2050, and 2060 may include wiring circuits.

Referring again to FIGS. 3 and 4, a lower insulating layer 1010 may be disposed between the substrate 1000 and the first circuit pattern layer 2020. The lower insulating layer 1010 may include an insulating material having good step coverage and gap fill characteristics. As an example, the lower insulating layer 1010 may include an oxide material such as tetraethyl orthosilicate (TEOS) or borophosphosilicate glass (BPSG).

A first intermetallic insulating layer 1020 may be disposed between the first circuit pattern layer 2020 and the second circuit pattern layer 2030. A second intermetallic insulating layer 1030 may be disposed between the second circuit pattern layer 2030 and the third circuit pattern layer 2040. A third intermetallic insulating layer 1040 may be disposed between the third circuit pattern layer 2040 and the fourth circuit pattern layer 2050. A fourth intermetallic insulating layer 1050 may be disposed between the fourth circuit pattern layer 2050 and the fifth circuit pattern layer 2060. Each of the first to fourth intermetallic insulating layers 1020, 1030, 1040, and 1050 may include an insulating material having a low dielectric constant for reducing the coupling capacitance occurring between adjacent circuit pattern layers. For example, each of the first to fourth intermetallic insulating layers 1020, 1030, 1040, and 1050 may include a compound including silicon (Si), carbon (C), oxygen (O), and hydrogen (H).

Referring to FIGS. 1 and 2 together, the first chip guard 200 may be disposed in the chip sealing region 20A. The first chip guard 200 may be disposed to surround the integrated circuit 100 of FIG. 2 along the first boundary E1 of FIG. 1. The first chip guard 200 may be, for example, of a rectangular ring shape and may be referred to as a guard ring structure.

The first chip guard 200 may form a barrier preventing external moisture from penetrating into the integrated circuit 100 of the chip region 10A. The first chip guard 200 may be electrically connected to a ground well 1001 (see FIG. 3) of the substrate 1000 to maintain a ground state. For example, the substrate 1000 may be a p-type doped substrate and the ground well 1001 may be a p-well doped with a higher concentration of the dopant than the substrate 1000.

FIG. 5 is a simplified schematic of a perspective view illustrating the first chip guard 200 of FIGS. 2 to 4. Referring to FIG. 5, the first chip guard 200 may include first to fifth guard metal layers 2021, 2031, 2041, 2051, and 2061 disposed over the substrate 1000 and spaced apart from each other in a direction (e.g., the z-direction) substantially perpendicular to the surface 1000S of the substrate 1000. In addition, the first chip guard 200 may include a lower contact layer 2021c connecting the first guard metal layer 2021 and the ground well 1001 of the substrate 1000, a first intermetallic contact layer 2031c connecting the first guard metal layer 2021 and the second guard metal layer 2031, a second intermetallic contact layer 2041c connecting the second guard metal layer 2031 and the third guard metal layer 2041, a third intermetallic contact layer 2051c connecting the third guard metal layer 2041 and the fourth guard metal layer 2051, and a fourth intermetallic contact layer 2061c connecting the fourth guard metal layer 2051 and the fifth guard metal layer 2061.

In an embodiment, as illustrated in FIGS. 3 to 5, each of the first and fifth guard metal layers 2021 and 2061 may include a single metal layer. On the other hand, each of the second to fourth guard metal layers 2031, 2041, and 2051 may include a pair of metal layers disposed adjacent to each other in a lateral direction (e.g., the x-direction). Accordingly, between the first and fifth guard metal layers 2021 and 2061, a pair of each of the second to fourth guard metal layers 2031, 2041, and 2051 may be connected to each other through the first to fourth intermetallic contact layers 2031c, 2041c, 2051c, and 2061c, respectively. In FIG. 5, the lower insulating layer 1010 and the first to fourth intermetallic insulating layers 1020, 1030, 1040, and 1050 shown in FIGS. 3 and 4 are omitted from illustration for convenience.

Referring to FIG. 5, the first to fifth guard metal layers 2021, 2031, 2041, 2051, and 2061, the lower contact layer 2021c, and the first to fourth intermetallic contact layers 2031c, 2041c, 2051c, and 2061c may extend in one direction (e.g., the y-direction) that is substantially parallel to the surface 1000S of the substrate 1000. Based on the above arrangement, in the plan view of FIG. 2, the first chip guard 200 may be disposed to continuously extend along the circumference of the chip region 10A. Accordingly, the first to fifth guard metal layers 2021, 2031, 2041, 2051, and 2061, the lower contact layer 2021c, and the first to fourth intermetallic contact layers 2031c, 2041c, 2051c, and 2061c may effectively block moisture from penetrating into the chip region 10A from the outside of the chip region 10A along the direction that is non-parallel to the one direction (e.g., the x-direction).

In the first chip guard 200, the lower contact layer 2021c may be connected to the ground well 1001 of the substrate 1000 to maintain the electrical ground potential. At least one of the first to fifth guard metal layers 2021, 2031, 2041, 2051, and 2061 of the first chip guard 200 may be electrically connected to a portion of the integrated circuit 100 of the chip region 10A. For example, the first chip guard 200 may provide the ground potential to the electronic devices of the chip region 10A.

Referring now back to the example of FIG. 5, dummy gate structures 2011 may be further disposed on the substrate 1000. Each of the dummy gate structures 2011 may have the same stack structure as the gate structure 2010 of the chip region 10a illustrated in FIG. 3 and FIG. 4. The dummy gate structures 2011 may extend in the y-direction. The dummy gate structures 2011 may be electrically connected to the integrated circuit 100 of the chip region 10A.

Referring back to FIGS. 1 and 2, the second chip guard 310 may be disposed adjacent to the first chip guard 200 of FIG. 2 in the scribe lane region 30 of FIG. 1. The second chip guard 310 may be disposed to surround the first chip guard 200 of FIG. 2 along the second boundary E2 of FIG. 1. The second chip guard 310 may be, for example, a structure disposed over the substrate 1000 in the form of a guard ring. The second chip guard may have a rectangular ring shape.

The second chip guard 310 may form a barrier preventing defects generated inside the first to fourth intermetallic insulating layers 1020, 1030, 1040, and 1050 outside the chip sealing region 20A from propagating to the chip sealing region 20A. As described above, each of the first to fourth intermetallic insulating layers 1020, 1030, 1040, and 1050 may include an insulating material having a low dielectric constant for reducing coupling capacitance occurring between adjacent metal layers. The insulating material having a low dielectric constant may include pores therein to lower the dielectric constant. Accordingly, when thermal contraction and expansion are repeated during a manufacturing process of the semiconductor wafer or an operation of the semiconductor chip, defects may be generated from the pores in the insulating material. The defects may include, for example, a crack or delamination of the insulating layer.

According to an embodiment of the present disclosure, the second chip guard 310 may be disposed as a barrier structure surrounding the chip sealing region 20A along the second boundary E2. It may be, thus, possible to prevent the defects generated in the first to fourth intermetallic insulating layers 1020, 1030, 1040, and 1050 of the scribe lane region 30 from propagating to the chip sealing region 20A and damaging the first chip guard 200. Because the first chip guard 200 supplies the ground potential to the integrated circuit 100 of the chip region 10A, the second chip guard 310 may structurally protect the first chip guard 200, thereby improving the electrical stability of the integrated circuit 100 in the chip region 10A.

Referring to FIGS. 3, 4, and 6, the second chip guard 310 may include first to fifth guard metal layers 2022, 2032, 2042, 2052, and 2062 that are disposed over the substrate 1000 and are spaced apart from each other in a direction (e.g., the z-direction) that is substantially perpendicular to the surface 1000S of the substrate 1000. As an example, in FIG. 6, the substrate 1000, the lower insulating layer 1010, the first to fourth intermetallic insulating layers 1020, 1030, 1040, and 1050 illustrated in FIGS. 3 and 4 are omitted for convenience of illustration.

In addition, the second chip guard 310 may include a first intermetallic contact layer 2032c connecting the first guard metal layer 2022 and the second guard metal layer 2032, a second intermetallic contact layer 2042c connecting the second guard metal layer 2032 and the third guard metal layer 2042, a third intermetallic contact layer 2052c connecting the third guard metal layer 2042 and the fourth guard metal layer 2052, and a fourth intermetallic contact layer 2062c connecting the fourth guard metal layer 2052 and the fifth guard metal layer 2062.

The first to fifth guard metal layers 2022, 2032, 2042, 2052, and 2062 of the second chip guard 310 may be positioned at substantially the same level and may be formed of substantially the same material as the first to fifth guard metal layers 2021, 2031, 2041, 2051, and 2061 of the first chip guard 200, respectively. Similarly, the first to fourth intermetallic contact layers 2032c, 2042c, 2052c, and 2062c of the second chip guard 310 may be positioned at substantially the same level and may be formed of substantially the same material as the first to fourth intermetallic contact layers 2031c, 2041c, 2051c, and 2061c of the first chip guard 200, respectively.

As an example, referring to FIGS. 3 and 4, the second chip guard 310 may not include the lower contact layer connecting the first guard metal layer 2022 and the substrate 1000, compared to the first chip guard 200. Accordingly, in the second chip guard 310, the first guard metal layer 2022 may not be directly connected to the substrate 1000. As shown in FIG. 3, in the second chip guard 310, the first guard metal layer 2022 may be electrically connected to the first test circuit pattern layer 2024 of the test circuit pattern 331 through the ground wiring layer 3020, and the first test circuit pattern layer 2024 may be electrically connected to the ground well 1002 of the substrate 1000, thereby grounding the second chip guard 310. The ground wiring layer 3020 may be a line pattern layer that extends in a lateral direction (e.g., the x-direction) on the lower insulating layer 1010.

Referring to FIG. 6, the first to fifth guard metal layers 2022, 2032, 2042, 2052, and 2062 may have first to fifth widths W1, W2, W3, W4, and W5 in a first direction (e.g., the x-direction), respectively. At least two of the first to fifth widths W1, W2, W3, W4, and W5 may be the same as each other. Alternatively, the first to fifth widths W1, W2, W3, W4, and W5 may be different from each other. As illustrated in FIGS. 3, 4, and 6, each of the first to fifth guard metal layers 2022, 2032, 2042, 2052, and 2062 may be formed of a single metal layer. The first to fourth intermetallic contact layers 2032c, 2042c, 2052c, and 2062c may connect different guard metal layers to each other.

Referring to FIG. 6, the first to fifth guard metal layers 2022, 2032, 2042, 2052, and 2062 and the first to fourth intermetallic contact layers 2032c, 2042c, 2052c, and 2062c may extend in a second direction (e.g., the y-direction) that is non-parallel to the first direction. Based on the above arrangement, in the plan view of FIG. 2, the second chip guard 310 may be disposed to extend continuously along the circumference of the first chip guard 200 in the form of a band. Accordingly, the first to fifth guard metal layers 2022, 2032, 2042, 2052, and 2062 and the first to fourth intermetallic contact layers 2032c, 2042c, 2052c, and 2062c may effectively prevent the defects from propagating from the scribe lane region 30 to the chip sealing region 20A.

The first to fifth guard metal layers 2022, 2032, 2042, 2052, and 2062 and the first to fourth intermetallic contact layers 2032c, 2042c, 2052c, and 2062c of FIG. 6 may be disposed to be connected in series to each other in a direction (i.e., the z-direction) that is substantially perpendicular to the surface 1000S of the substrate 1000 of FIGS. 3 and 4.

Referring back to FIGS. 1 and 2, the third chip guard 320 of FIG. 2 may be disposed in the scribe lane region 30 of FIG. 1. The third chip guard 320 may be disposed farther than the second chip guard 310 with respect to the chip region 10A.

The third chip guard 320 may be disposed along the circumference of the second chip guard 310. The third chip guard 320 may include first to third pattern structures 321, 322, and 323 that are disposed to be spaced apart from each other. The first pattern structure 321, the second pattern structure 322, and the third pattern structure 323 may be sequentially disposed in an outward direction (e.g., the x-direction of FIGS. 3 and 4) from the second chip guard 310 and may have different perimeter lengths.

Referring to FIG. 2, each of the first to third pattern structures 321, 322, and 323 of the third chip guard 320 may include a plurality of stack patterns that are discontinuously disposed along the circumference of the second chip guard 310. The first to third pattern structures 321, 322, and 323 may have substantially the same stack structure.

In an embodiment, referring to FIGS. 4 and 7, the first pattern structure 321 may include first to fifth dummy metal pattern layers 2023, 2033, 2043, 2053, and 2063 that are disposed over the substrate 1000 and are spaced apart from each other in a direction (e.g., the z-direction) substantially perpendicular to the surface 1000S of the substrate 1000. In addition, the first pattern structure 321 may include a first contact pattern layer 2033c connecting the first dummy metal pattern layer 2023 and the second dummy metal pattern layer 2033, a second contact pattern layer 2043c connecting the second dummy metal pattern layer 2033 and the third dummy metal pattern layer 2043, a third contact pattern layer 2053c connecting the third dummy metal pattern layer 2043 and the fourth dummy metal pattern layer 2053, and a fourth contact pattern layer 2063c connecting the fourth dummy metal pattern layer 2053 and the fifth dummy metal pattern layer 2063.

The first to fifth dummy metal pattern layers 2023, 2033, 2043, 2053, and 2063 of the first pattern structure 321 may be positioned at substantially the same level and may be made of substantially the same material as the first to fifth guard metal layers 2022, 2032, 2042, 2052, and 2062 of the second chip guard 310, respectively. In addition, the first to fourth contact pattern layers 2033c, 2043c, 2053c, and 2063c of the first pattern structure 321 may be positioned at substantially the same level and may be made of substantially the same material as the first to fourth intermetallic contact layers 2032c, 2042c, 2052c, and 2062c of the second chip guard 310, respectively.

However, as illustrated in FIG. 3, in the region where the ground wiring layer 3020 is formed between the first guard metal layer 2022 of the second chip guard 310 and the first test circuit pattern layer 2024 of the test circuit pattern 331, the first dummy metal pattern layer 2023 and the first contact pattern layer 2033c of the first pattern structure 321 may not be formed. In FIG. 7, the substrate 1000, the lower insulating layer 1010, and the first to fourth intermetallic insulating layers 1020, 1030, 1040, and 1050 illustrated in FIGS. 3 and 4 are omitted for convenience of illustration.

Referring to FIG. 7, the first to fifth dummy metal pattern layers 2023, 2033, 2043, 2053, and 2063 may have first to fifth widths W1a, W2a, W3a, W4a, and W5a in the first direction (e.g., the x-direction), respectively. At least two of the first to fifth widths W1a, W2a, W3a, W4a, and W5a may be the same as each other. Alternatively, the first to fifth widths W1a, W2a, W3a, W4a, and W5a may be different from each other. In addition, the first to fifth dummy metal pattern layers 2023, 2033, 2043, 2053, and 2063 may have first to fifth lengths L1a, L2a, L3a, L4a, and L5a, respectively, in the second direction (e.g., the y-direction) that is non-parallel to the first direction. The first to fourth contact pattern layers 2033c, 2043c, 2053c, and 2063c may connect different dummy metal pattern layers to each other.

Referring back to FIG. 2, the first pattern structure 321 may be discontinuously disposed along the circumference of the second chip guard 310. Similarly, the second pattern structure 322 may be spaced apart from the first pattern structure 321 and may be discontinuously disposed along the circumference of the second chip guard 310. Similarly, the third pattern structure 323 may be spaced apart from the first and second pattern structures 321 and 322, and may be discontinuously disposed along the circumference of the second chip guard 310. The second and third pattern structures 322 and 323 may have substantially the same structure as the first pattern structure 321.

FIGS. 2 to 4 illustrate that the third chip guard 320 includes three pattern structures 321, 322, and 323, however, the embodiment of the present disclosure is not limited thereto, and the third chip guard 320 may include various numbers of pattern structures. The third chip guard 320 may perform substantially the same function as the second chip guard 310. That is, the third chip guard 320 may form a barrier to prevent the defects generated in the scribe lane region 30 from propagating to the chip sealing region 20A.

Referring to FIGS. 1 and 2 again, the test circuit patterns 331 and 332 of FIG. 2 may be disposed in the scribe lane region 30 of FIG. 1. The test circuit patterns 331 and 332 may be disposed farther than the third chip guard 320 with respect to the chip region 10A.

The test circuit patterns 331 and 332 may be circuit patterns configured by copying the integrated circuit 100 in a portion of the scribe lane region 30, to perform various electrical tests on the integrated circuit 100 of the chip region 10A instead.

Referring to FIG. 3, the test circuit pattern 331 may include first to fifth test circuit pattern layers 2024, 2034, 2044, 2054, and 2064 disposed over the substrate 1000 and are spaced apart from each other in a direction (e.g., the z-direction) that is substantially perpendicular to the surface 1000S of the substrate 1000. In addition, the test circuit pattern 331 may include a lower contact pattern layer 2024c connecting the first test circuit pattern layer 2024 and the ground well 1002 of the substrate 1000, a first contact pattern layer 2034c connecting the first test circuit pattern layer 2024 and the second test circuit pattern layer 2034, a second contact pattern layer 2044c connecting the second test circuit pattern layer 2034 and the third test circuit pattern layer 2044, a third contact pattern layer 2054c connecting the third test circuit pattern layer 2044 and the fourth test circuit pattern layer 2054, and a fourth contact pattern layer 2064c connecting the fourth test circuit pattern layer 2054 and the fifth test circuit pattern layer 2064.

In an embodiment, a portion of the fifth test circuit pattern layer 2064 may be applied to the test circuit pattern 331 as a ground pad 331P. As shown in FIG. 3, the ground pad 331P may be connected to the ground well 1002 of the substrate 1000 through the first to fifth test circuit pattern layers 2024, 2034, 2044, 2054, and 2064, the lower contact pattern layer 2024c, and the first to fourth contact pattern layers 2034c, 2044c, 2054c, and 2064c. Through this, a ground line as an electrical circuit from the ground pad 331P to the ground well 1002 of the substrate 1000 may be formed. In addition, the ground pad 331P may receive a ground potential directly from an external test equipment and may transfer the ground potential to the electric circuits inside the test circuit pattern 331 when performing an electrical test on the test circuit pattern 331 using external test equipment.

The first to fifth test circuit pattern layers 2024, 2034, 2044, 2054, and 2064 of the test circuit pattern 331 may be positioned at substantially the same level and may be made of substantially the same material as the first to fifth guard metal layers 2022, 2032, 2042, 2052, and 2062 of the second chip guard 310, respectively. In addition, the first to fourth contact pattern layers 2033c, 2043c, 2053c, and 2063c of the test circuit pattern 331 may be positioned at substantially the same level and may be made of substantially the same material as the first to fourth intermetallic contact layers 2032c, 2042c, 2052c, and 2062c of the second chip guard 310, respectively.

As described above, according to the embodiment of the present disclosure, the second chip guard 310 and the test circuit patterns 331, 332, 333, 334, 335, 336, 337, and 338 may be disposed in the scribe lane region 30 positioned outside the chip sealing regions 20A, 20B, 20C, and 20D. The second chip guard 310 may not be directly connected to the substrate 1000, however, may be connected to the ground line of the test circuit patterns 331, 332, 333, 334, 335, 336, 337, and 338 through the ground wiring layer 3020, thereby maintaining the ground potential.

Specifically, as illustrated in FIG. 3, the ground wiring layer 3020 may connect the first guard metal layer 2022 of the second chip guard 310 and the first test circuit pattern layer 2024 of the test circuit pattern 331. The ground wiring layer 3020 may be positioned at the same level as the first guard metal layer 2022 and the first test circuit pattern layer 2024 over the substrate 1000. The first test circuit pattern layer 2024 may be electrically connected to the ground well 1002 of the substrate 1000 through the lower contact pattern layer 2024c.

Referring back to FIG. 2, the second chip guard 310 may continuously extend and disposed in the form of a band surrounding the first chip guard 200, and the first to fifth guard metal layers 2022, 2032, 2042, 2052, and 2062 and the first to fourth intermetallic contact layers 2032c, 2342c, 2052c, and 2062c of the second chip guard 310 may be connected to each other in the direction that is substantially perpendicular to the surface 1000S of the substrate 1000. Accordingly, in the case in which some of the guard metal layers among the first to fifth guard metal layers 2022, 2032, 2042, 2052 and 2062 and some of the intermetallic contact layers among the first to fourth intermetallic contact layers 2032c, 2342c, 2052c, and 2062c fail to maintain the ground state, electrical arcs may occur in the electrically floating portions of the guard metal layer and the intermetallic contact layer. The electrical arcs may electrically or structurally damage the second chip guard 310. According to an embodiment of the present disclosure, the damage of the second chip guard 310 due to the electric arcs may be prevented by maintaining the second chip guard 310 in a ground state through the ground line of the test pattern circuit.

As an example, in the case of the third chip guard 320, because each of the first to third pattern structures 321, 322, and 323 includes the plurality of stack patterns that are discontinuously extended along the circumference of the second chip guard 310, and even if some of the plurality of stack patterns of the first to third pattern structures 321, 322, and 323 are electrically floated, a portion where the first to third pattern structures 321, 322, and 223 are damaged by the electric arcs may be relatively small, compared to the second chip guard 310.

In some embodiments, the third chip guard 320 may be omitted. Accordingly, only the second chip guard 310 may be disposed along the circumference of the first chip guard 200.

Figure 8:
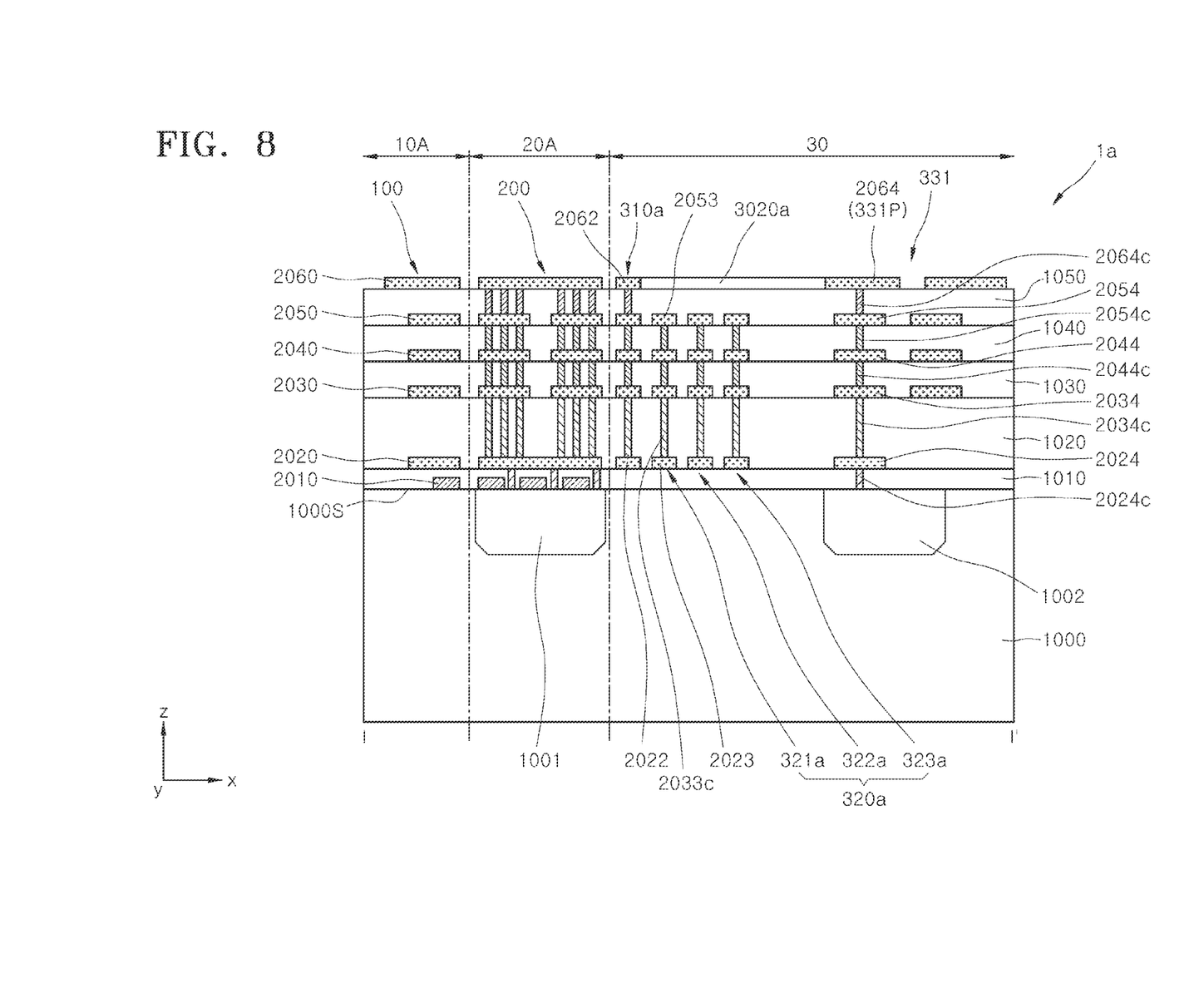
FIG. 8 is a simplified schematic of a cross-sectional view illustrating a semiconductor wafer according to another embodiment of the present disclosure.

FIG. 8 is a simplified schematic of a cross-sectional view illustrating a semiconductor wafer 1a according to another embodiment of the present disclosure. FIG. 8 may be a simplified schematic of a cross-sectional view of the semiconductor wafer 1a according to another embodiment of the present disclosure, taken in substantially the same direction as the line I-I' of FIG. 2.

Referring to FIG. 8, a second chip guard 310a, a third chip guard 320a, a ground wiring layer 3020a of the semiconductor wafer 1a may be different from those of the semiconductor wafer 1 of FIG. 3 in configurations.

A fifth guard metal layer 2062 of the second chip guard 310a may be electrically connected to a ground pad 331P, which is a portion of a fifth test circuit pattern layer 2064 of the test circuit pattern 331 through the ground wiring layer 3020a. The ground wiring layer 3020a may be a line pattern layer that extends in a lateral direction (e.g., the x-direction) on a fourth intermetallic insulating layer 1050. The ground pad 331P may be electrically connected to a ground well 1002 of a substrate 1000 through the ground line. In an embodiment, the ground wiring layer 3020a may be positioned at the same level as the fifth guard metal layer 2062 and the fifth test circuit pattern layer 2064.

As an example, referring to FIG. 8, each of the first to third pattern structures 321a, 322a, and 323a of the third chip guard 320a may further include a first dummy metal pattern layer 2023 and a first contact pattern layer 2033c that are disposed on a lower insulating layer 1010, compared to the first to third pattern structures 321, 322, and 323 of the third chip guard 320 of FIG. 3. In addition, in the case of the first to third pattern structures 321a, 322a, and 323a of the third chip guard 320a, the fifth dummy metal pattern layer 2063 and the fourth contact pattern layer 2063c that are disposed on the fourth intermetallic insulating layer 1050 may be omitted in a region adjacent to the test circuit pattern 331, compared to the first to third pattern structures 321, 322, and 323 of the third chip guard 320 of FIG. 3.

Figure 9:
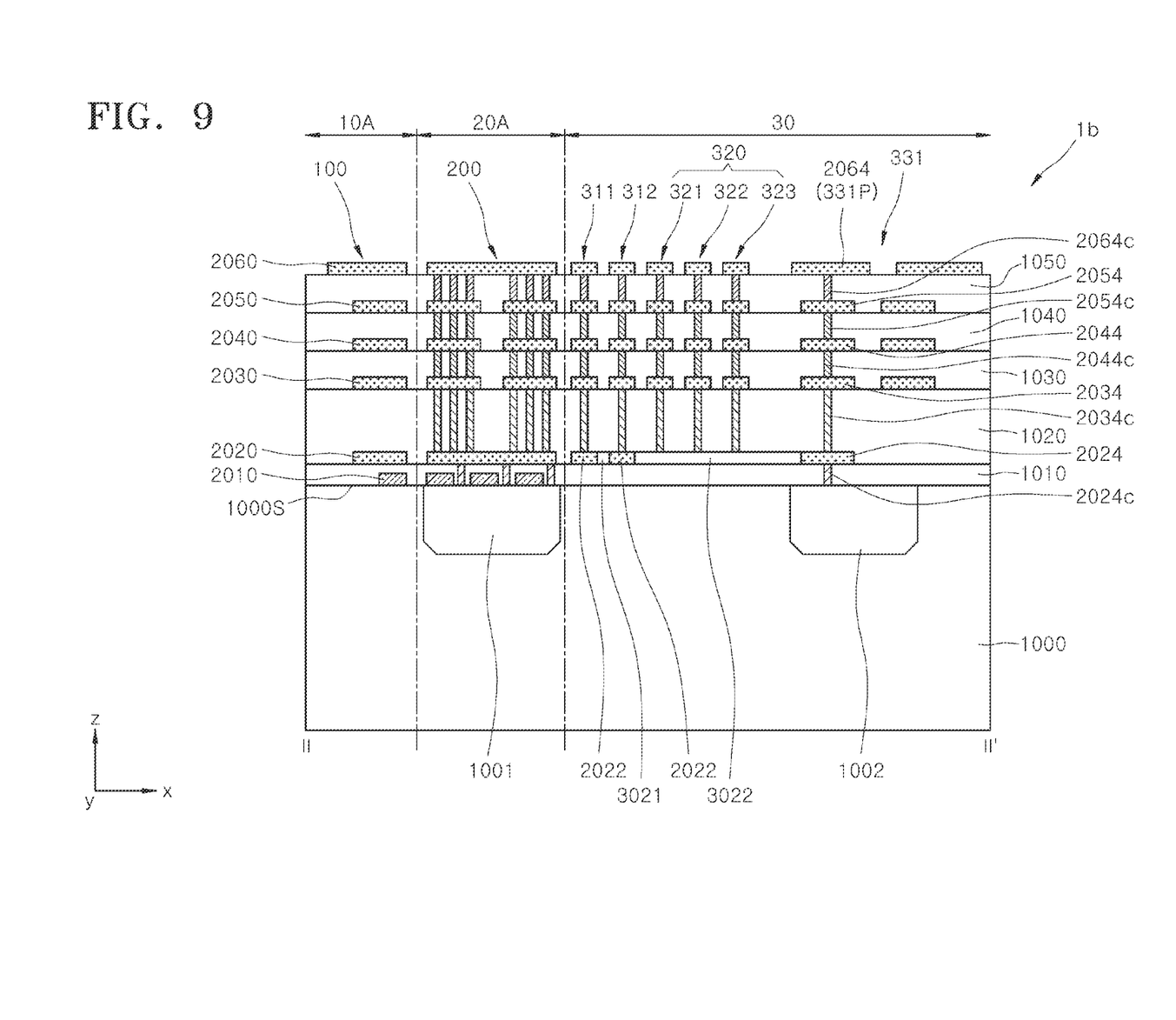
FIG. 9 is a simplified schematic of a cross-sectional view illustrating a semiconductor wafer according to yet another embodiment of the present disclosure.

FIG. 9 is a simplified schematic of a cross-sectional view illustrating a semiconductor wafer 1b according to yet another embodiment of the present disclosure. FIG. 9 may be a simplified schematic of a cross-sectional view of the semiconductor wafer 1b according to yet another embodiment of the present disclosure, taken in substantially the same direction as the line I-I' of FIG. 2.

Referring to FIG. 9, the semiconductor wafer 1b may include a plurality of second chip guards 311 and 312, compared to the semiconductor wafer 1 of FIG. 3. Each of the plurality of second chip guards 311 and 312 may be disposed to surround a first chip guard 200. In this embodiment, the second chip guard 311 adjacent to the first chip guard 200 among the plurality of second chip guards 311 and 312 may be referred to as an "internal chip guard", and the second chip guard 312 disposed further from the first chip guard 200 may be referred to as an "external chip guard".

The first guard metal layers 2022 of the internal chip guard 311 and the external chip guard 312 may be connected to each other by a first ground wiring layer 3021. The first guard metal layer 2022 of the external chip guard 312 may be connected to a first test circuit pattern layer 2024 of a test circuit pattern 331 through a second ground wiring layer 3022. The first test circuit pattern layer 2024 may be electrically connected to a ground well 1002 of a substrate 1000 by a lower contact pattern layer 2024c, so that the internal chip guard 311 and the external chip guard 312 may maintain the electrical ground potential.

Although FIG. 9 illustrates one internal chip guard 311 and one external chip guard 312 as the plurality of second chip guards 311 and 312, the number of the second chip guards may not necessarily be limited thereto and various other numbers are possible. The configuration of the semiconductor wafer 1b having the plurality of second chip guards may be substantially identically applied to the semiconductor wafer 1a described above with reference to FIG. 8.

The inventive concept has been disclosed in conjunction with some embodiments as described above. Those skilled in the art will appreciate that various modifications, additions and substitutions are possible, without departing from the scope and spirit of the present disclosure. Accordingly, the embodiments disclosed in the present specification should be considered from not a restrictive standpoint however, an illustrative standpoint. The scope of the inventive concept is not limited to the above descriptions however, defined by the accompanying claims, and all of distinctive features in the equivalent scope should be construed as being included in the inventive concept.

What is claimed is:

1. A semiconductor wafer comprising:
   at least one chip region disposed in a substrate;
   a first chip guard disposed over the substrate in a chip sealing region positioned outside the at least one chip region, the first chip guard being electrically connected to a first ground well formed in the chip sealing region;
   a second chip guard disposed over the substrate in a scribe lane region positioned outside the chip sealing region; and
   a test circuit pattern disposed in the scribe lane region and laterally spaced apart from the second chip guard, the test circuit pattern including a ground line electrically connected to a second ground well formed in the scribe lane region,
   wherein the second chip guard includes a ground wiring layer that is laterally extended and is electrically connected to the ground line of the test circuit pattern,
   wherein the second chip guard is electrically connected to the second ground well via the ground wiring layer and the ground line, without a direct electrical path from the second chip guard to the substrate for electrically grounding the second chip guard.

2. The semiconductor wafer of claim 1,
wherein the first chip guard is disposed to surround the chip region, and
wherein the second chip guard is disposed to surround the first chip guard.

3. The semiconductor wafer of claim 1, further comprising another second chip guard adjacent the second chip guard,
wherein the another second chip guard surrounds the first chip guard with a perimeter length that is different from a perimeter length of the second chip guard.

4. The semiconductor wafer of claim 1,
wherein the first chip guard is electrically connected to a circuit pattern layer of the chip region, and
wherein the second chip guard is electrically insulated from the first chip guard.

5. The semiconductor wafer of claim 1, wherein the first chip guard includes:
at least two guard metal layers disposed over the substrate to be spaced apart from each other in a direction that is substantially perpendicular to a surface of the substrate;
an intermetallic contact layer connecting the at least two guard metal layers to each other; and
a lower contact layer connecting a lowermost guard metal layer among the at least two guard metal layers and the first ground well of the substrate.

6. The semiconductor wafer of claim 1, wherein the second chip guard includes:
at least two guard metal layers disposed over the substrate to be spaced apart from each other in a direction that is substantially perpendicular to a surface of the substrate; and
an intermetallic contact layer connecting the at least two guard metal layers to each other,
wherein the ground wiring layer electrically connects one of the at least two guard metal layers and the ground line.

7. The semiconductor wafer of claim 6, wherein the ground wiring layer extends from a lowermost guard metal layer among the at least two guard metal layers to the test circuit pattern.

8. The semiconductor wafer of claim 6, wherein the ground wiring layer extends from an uppermost guard metal layer among the at least two guard metal layers to the test circuit pattern.

9. The semiconductor wafer of claim 6, wherein each of the at least two guard metal layers and the intermetallic contact layer is a band-shaped pattern layer surrounding the chip region.

10. The semiconductor wafer of claim 6, wherein the at least two guard metal layers and the intermetallic contact layer are disposed to be connected to each other in series in the direction that is substantially perpendicular to the surface of the substrate.

11. The semiconductor wafer of claim 1,
wherein the ground wiring layer is electrically connected to a ground pad of the test circuit pattern, and
wherein the ground pad is electrically connected to the second ground well of the substrate through at least one contact pattern layer.

12. The semiconductor wafer of claim 1, further comprising a third chip guard disposed along a circumference of the second chip guard in the scribe lane region.

13. The semiconductor wafer of claim 12, wherein the third chip guard includes:
two or more dummy metal pattern layers spaced apart from each other in a direction that is substantially perpendicular to a surface of the substrate; and
a contact pattern layer connecting the two or more dummy metal pattern layers to each other.

14. The semiconductor wafer of claim 13, wherein the two or more dummy metal pattern layers are discontinuously disposed along the circumference of the second chip guard.

15. A semiconductor wafer comprising:
at least one chip region disposed in a substrate;
a chip guard disposed over the substrate in a scribe lane region disposed outside the at least one chip region; and
a test circuit pattern disposed in the scribe lane region and laterally spaced apart from the chip guard, the test circuit pattern including a ground line electrically connected to a ground well of the substrate,
wherein the chip guard includes a ground wiring layer that is laterally extended and is electrically connected to the ground line,
wherein the chip guard is electrically connected to the ground well via ground wiring layer and the ground line, without a direct electrical path from the chip guard to the substrate for electrically grounding the chip guard.

16. The semiconductor wafer of claim 15, wherein the chip guard is disposed to surround the at least one chip region.

17. The semiconductor wafer of claim 15, wherein the chip guard includes:
at least two guard metal layers disposed over the substrate to be spaced apart from each other in a direction that is substantially perpendicular to a surface of the substrate; and
an intermetallic contact layer connecting the at least two guard metal layers to each other,
wherein the ground wiring layer electrically connects one of the at least two guard metal layers to the ground line.

18. The semiconductor wafer of claim 17, wherein the ground wiring layer extends from a lowermost guard metal layer among the at least two guard metal layers to the test circuit pattern.

19. The semiconductor wafer of claim 17, wherein the ground wiring layer extends from an uppermost guard metal layer among the at least two guard metal layers to the test circuit pattern.

20. The semiconductor wafer of claim 17, wherein each of the at least two guard metal layers and the intermetallic contact layer is a band-shaped pattern layer surrounding the chip region.

21. The semiconductor wafer of claim 17, wherein the at least two guard metal layers and the intermetallic contact layer are disposed to be connected in series to each other in the direction that is substantially perpendicular to the surface of the substrate.

22. The semiconductor wafer of claim 15, further comprising an additional chip guard disposed in the scribe lane region along a circumference of the chip guard.

23. The semiconductor wafer of claim 22, wherein the additional chip guard includes:
two or more dummy metal layers disposed to be spaced apart from each other in a direction that is substantially perpendicular to a surface of the substrate; and
a contact pattern layer connecting the two or more dummy metal layers to each other.

24. The semiconductor wafer of claim 23, wherein the two or more dummy metal layers are discontinuously disposed along the circumference of the chip guard.

25. A semiconductor wafer comprising:
- at least four chip regions disposed in a substrate;
- at least four chip sealing regions corresponding to said at least four chip regions, wherein each of the at least four chip sealing regions surrounds a corresponding one of the at least four chip regions;
- a scribe lane region surrounding all of the at least four chip sealing regions and filling a space between the at least four chip sealing regions; and
- test circuit patterns positioned laterally each of said at least four chip regions in the scribe lane region,
- wherein the semiconductor wafer further comprising:
- integrated circuits in the at least four chip regions;
- first chip guards in the at least four chip sealing regions, the first chip guards being directly connected to first ground wells formed in the at least four chip sealing regions; and
- second chip guards in the scribe lane region,
- wherein the test circuit patterns are disposed to be laterally spaced apart from the second chip guards,
- wherein the test circuit patterns include ground lines electrically connected to second ground wells formed in the scribe lane region,
- wherein the second chip guards include ground wiring layers that are laterally extended and are electrically connected to the ground lines of the test circuit patterns,
- wherein the second chip guards are electrically connected to second ground wells of the substrate via the ground wiring layers and the ground lines, without direct electrical paths from the second chip guards to the substrate for electrically grounding the second chip guards.

* * * * *